US007897521B2

(12) United States Patent

Jung et al.

(10) Patent No.: US 7,897,521 B2

(45) Date of Patent: Mar. 1, 2011

(54) LOW DIELECTRIC CONSTANT PLASMA POLYMERIZED THIN FILM AND MANUFACTURING METHOD THEREOF

(75) Inventors: Donggeun Jung, Seoul (KR); Sungwoo Lee, Gyeonggi-do (KR); Jihyung Woo, Uiwang-si (KR)

(73) Assignee: Sungkyunkwan University Foundation For Corporate Collaboration, Gyeonggi-Do (KR)

( * ) Notice: Subject to any disclaimer, the term of this patent is extended or adjusted under 35 U.S.C. 154(b) by 225 days.

(21) Appl. No.: 12/228,668

(22) Filed: Aug. 14, 2008

(65) Prior Publication Data

US 2009/0054612 A1 Feb. 26, 2009

(30) Foreign Application Priority Data

Dec. 6, 2007 (KR) ...................... 10-2007-0126331

(51) Int. Cl.

*H01L 21/20* (2006.01)
*H01L 21/203* (2006.01)
*H01L 21/205* (2006.01)

(52) U.S. Cl. ....................... 438/781; 438/787; 438/788; 438/789

(58) Field of Classification Search .................. 427/489
See application file for complete search history.

(56) References Cited

U.S. PATENT DOCUMENTS 4,877,641 A * 10/1989 Dory .......................... 427/574
4,894,532 A * 1/1990 Peterson et al. ............. 250/226
5,000,113 A * 3/1991 Wang et al. .............. 118/723 E
5,203,956 A * 4/1993 Hansen ........................ 216/63
5,288,325 A * 2/1994 Gomi ......................... 118/692
5,354,516 A * 10/1994 Tomita .................... 261/121.1
5,362,526 A 11/1994 Wang et al.
5,444,217 A * 8/1995 Moore et al. ................ 219/405
5,552,181 A * 9/1996 Kondoh et al. ........... 427/248.1
6,130,118 A * 10/2000 Yamazaki ................... 438/151
6,312,793 B1 * 11/2001 Grill et al. ............... 428/312.6
6,393,210 B1 * 5/2002 Wu ............................ 392/416
6,441,491 B1 * 8/2002 Grill et al. .................. 257/759
6,497,963 B1 * 12/2002 Grill et al. .................. 428/446
6,797,643 B2 9/2004 Rocha-Alvarez et al.
6,815,014 B2 * 11/2004 Gabelnick et al. ........... 427/488
6,943,127 B2 * 9/2005 Cho et al. ................... 438/789

(Continued)

FOREIGN PATENT DOCUMENTS

CN 1782125 6/2006

(Continued)

OTHER PUBLICATIONS

European Search Report in European Patent Application No. 08170636.8.

*Primary Examiner*—Randy Gulakowski
*Assistant Examiner*—Robert Loewe
(74) *Attorney, Agent, or Firm*—Kinney & Lange, P.A.

(57) ABSTRACT

Disclosed is a low dielectric constant plasma polymerized thin film using linear organic/inorganic precursors and a method of manufacturing the low dielectric constant plasma polymerized thin film through plasma enhanced chemical vapor deposition and annealing using an RTA apparatus. The low dielectric constant plasma polymerized thin film is effective for the preparation of multilayered metal thin films having a thin film structure with very high thermal stability, a low dielectric constant, and superior mechanical properties.

19 Claims, 13 Drawing Sheets

U.S. PATENT DOCUMENTS

| | | | | |
|---|---|---|---|---|
| 6,949,272 | B2 * | 9/2005 | Wochnowski et al. | 427/489 |
| 7,087,271 | B2 * | 8/2006 | Rhee et al. | 427/577 |
| 7,491,658 | B2 | 2/2009 | Nguyen et al. | |
| 7,678,712 | B2 * | 3/2010 | Bhanap et al. | 438/787 |
| 2003/0171004 | A1 * | 9/2003 | Vulpio | 438/780 |
| 2004/0058090 | A1 * | 3/2004 | Waldfried et al. | 427/558 |
| 2004/0197474 | A1 * | 10/2004 | Vrtis et al. | 427/255.28 |
| 2005/0230834 | A1 * | 10/2005 | Schmitt et al. | 257/758 |
| 2006/0079099 | A1 * | 4/2006 | Nguyen et al. | 438/789 |
| 2006/0151884 | A1 * | 7/2006 | Hara et al. | 257/759 |
| 2007/0077353 | A1 | 4/2007 | Lee et al. | |
| 2007/0117408 | A1 * | 5/2007 | Nguyen et al. | 438/780 |
| 2007/0173071 | A1 * | 7/2007 | Afzali-Ardakani et al. | 438/781 |

FOREIGN PATENT DOCUMENTS

| | | | |
|---|---|---|---|
| EP | 1482070 | A1 | 12/2004 |
| EP | 1820881 | A2 | 8/2007 |
| WO | WO2004083495 | A2 | 9/2004 |
| WO | WO2008117905 | A1 | 10/2008 |

* cited by examiner

LOW DIELECTRIC CONSTANT PLASMA POLYMERIZED THIN FILM AND MANUFACTURING METHOD THEREOF

BACKGROUND OF THE INVENTION

1. Field of the Invention

The present invention relates in general to a low dielectric constant plasma polymerized thin film and a manufacturing method thereof, and more particularly, to a plasma polymerized thin film for use in semiconductor devices, which has a low dielectric constant and is also improved in terms of mechanical properties including hardness and elastic modulus, and to a method of manufacturing the same.

2. Description of the Related Art

Presently, one of the chief steps in the fabrication of a semiconductor apparatus is the formation of metal and dielectric thin films on a substrate through the chemical reaction of gases. This deposition process is referred to as chemical vapor deposition (CVD). Typically, in a thermal CVD process, reactant gases are supplied to the surface of a substrate, so that a thermally-induced chemical reaction occurs on the surface of the substrate, thus forming a thin film of a predetermined thickness. Such a thermal CVD process is conducted at high temperatures, which may thus damage device geometries in which layers are formed on the substrate. A preferred example of a method of depositing metal and dielectric thin films at relatively low temperatures includes plasma-enhanced CVD (PECVD) disclosed in U.S. Pat. No. 5,362,526, entitled "Plasma-enhanced CVD process using TEOS for depositing silicon oxide", which is hereby incorporated by reference into this application.

According to PECVD, radio frequency (RF) energy is applied to a reaction zone, thus promoting the excitation and/or dissociation of reactant gases, thereby creating plasma of highly reactive species. High reactivity of the released species reduces the energy required for a chemical reaction to take place and thus lowers the required temperature for such PECVD. Thus, semiconductor device geometries have dramatically decreased in size due to the introduction of such an apparatus and method.

Further, in order to decrease the RC delay of the multilayered metal film used for integrated circuits of a ULSI semiconductor device, thorough research into preparation of interlayer insulating films used for metal wires using material having a low dielectric constant ($k \leqq 2.4$) is being conducted these days. Such a low dielectric constant thin film is formed of an organic material or an inorganic material such as a fluorine (F)-doped oxide film ($SiO_2$) and a fluorine-doped amorphous carbon film (a-C:F). Polymerized thin films having a relatively low dielectric constant and relatively superior thermal stability are used mainly as an organic material.

Very useful to date are interlayer insulating films of silicon dioxide ($SiO_2$) or silicon oxyfluoride (SiOF), which have some defects, such as high capacitance and long RC delay time, upon fabrication of ultra-highly integrated circuits of 0.5 μm or less, and thus intensive research into substituting for it a novel low dielectric constant material is being conducted recently, but satisfactory solutions have not yet been proposed.

Examples of the low dielectric constant material presently usable instead of SiO2 include organic polymers for spin coating, such as BCB (benzocyclobutene), SILK (available from DOW Chemical), FLARE (fluorinated poly(arylene ether), available from AlliedSignal, now Honeywell International), and polyimide, materials for CVD, such as Black Diamond (available from Applied Materials), Coral (available from Novellus), SiOF, alkyl silane, and parylene, and porous thin film materials, such as xerogel or aerogel.

Most polymerized thin films are formed through spin casting by which a polymer is chemically synthesized, applied on a substrate through spin coating, and then cured. The low dielectric constant thin film thus formed advantageously has a low dielectric constant because the pores having a size of single-digits of nanometers are formed in the thin film, thus lowering the density of the thin film. The organic polymers which are typically deposited through spin coating have a low dielectric constant and superior planarization, but have poor thermal stability due to low heat-resistant threshold temperatures below 450° C. and are thus inadequate in terms of availability. Further, the above organic polymers are disadvantageous because the pores are non-uniformly distributed in the film owing to a large size thereof, thus causing many problems upon the manufacture of devices. Furthermore, the above organic polymers are problematic in that they come into poor contact with upper and lower wiring materials, that thin films resulting therefrom intrinsically incur high stress upon thermal curing, and also that the dielectric constant thereof varies attributable to water absorption, undesirably decreasing the reliability of the device.

SUMMARY OF THE INVENTION

Leading to the present invention, thorough research into methods of manufacturing thin films having a very low dielectric constant, carried out by the present inventors aiming to solve the problems encountered in the related art, resulted in the finding that, when a plasma polymerized thin film is formed through PECVD using linear organic/inorganic precursors, pores having a size of nanometers or smaller may be formed, problems arising in spin casting including a complicated process and a long process time for pretreatment and post-treatment may be overcome, and the dielectric constant and mechanical properties of thin films may be improved through annealing.

Therefore, the present invention provides a low dielectric constant plasma polymerized thin film which is improved in terms of dielectric constant and mechanical properties and also provides a method of manufacturing the same.

According to an aspect of the present invention, a low dielectric constant plasma polymerized thin film may be manufactured using precursors represented by Formulas 1 and 2 below.

Formula 1

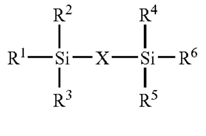

wherein $R^1$ to $R^6$ are each independently selected from the group consisting of a hydrogen atom and substituted or unsubstituted $C_{1\sim5}$ alkyl groups, and X is an oxygen atom or a $C_{1\sim5}$ alkylene group.

Formula 2

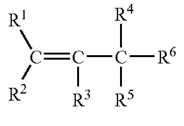

wherein $R^1$ to $R^6$ are each independently selected from the group consisting of a hydrogen atom and substituted or unsubstituted $C_{1\sim5}$ alkyl groups.

The low dielectric constant polymerized thin film may be manufactured using PECVD.

The precursor represented by Formula 1 may be hexamethyldisiloxane, and the precursor represented by Formula 2 may be 3,3-dimethyl-1-butene.

In addition, according to another aspect of the present invention, a method of manufacturing a low dielectric constant plasma polymerized thin film may comprise depositing a plasma polymerized thin film on a substrate using precursors represented by Formulas 1 and 2 below through PECVD, and annealing the deposited thin film using a rapid thermal annealing (RTA) apparatus.

Formula 1

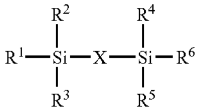

wherein $R^1$ to $R^6$ are each independently selected from the group consisting of a hydrogen atom and substituted or unsubstituted $C_{1\sim5}$ alkyl groups, and X is an oxygen atom or a $C_{1\sim5}$ alkylene group.

Formula 2

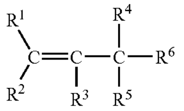

wherein $R^1$ to $R^6$ are each independently selected from the group consisting of a hydrogen atom and substituted or unsubstituted $C_{1\sim5}$ alkyl groups.

As such, the precursor represented by Formula 1 may be hexamethyldisiloxane, and the precursor represented by Formula 2 may be 3,3-dimethyl-1-butene.

In the method according to the present invention, depositing the plasma polymerized thin film on the substrate may comprise vaporizing the precursors represented by Formulas 1 and 2 in bubblers, supplying the gaseous precursors into a reactor for plasma deposition from the bubblers, and forming a plasma polymerized thin film on the substrate in the reactor using plasma of the reactor.

The pressure of the carrier gas of the reactor may be $1\times10^{-1}\sim100\times10^{-1}$ Torr, the temperature of the substrate may be 20~50° C., and power supplied to the reactor may be 15~80 W.

In the method according to the present invention, annealing the deposited thin film using the RTA apparatus may be conducted by placing the substrate having the plasma polymerized thin film deposited thereon in a chamber of the RTA apparatus, and generating heat on the substrate using a plurality of halogen lamps disposed around the chamber.

Also, annealing the deposited thin film using the RTA apparatus may be conducted in nitrogen gas. In the method according to the present invention, annealing the deposited thin film using the RTA apparatus may be conducted by increasing the temperature of the substrate to 300~600° C. and then performing annealing, and preferably by increasing the temperature of the substrate to 300~600° C. within 5 min and then performing annealing for 1~5 min.

Further, annealing the deposited thin film using the RTA apparatus may be conducted at a pressure of 0.5~1.5 Torr.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
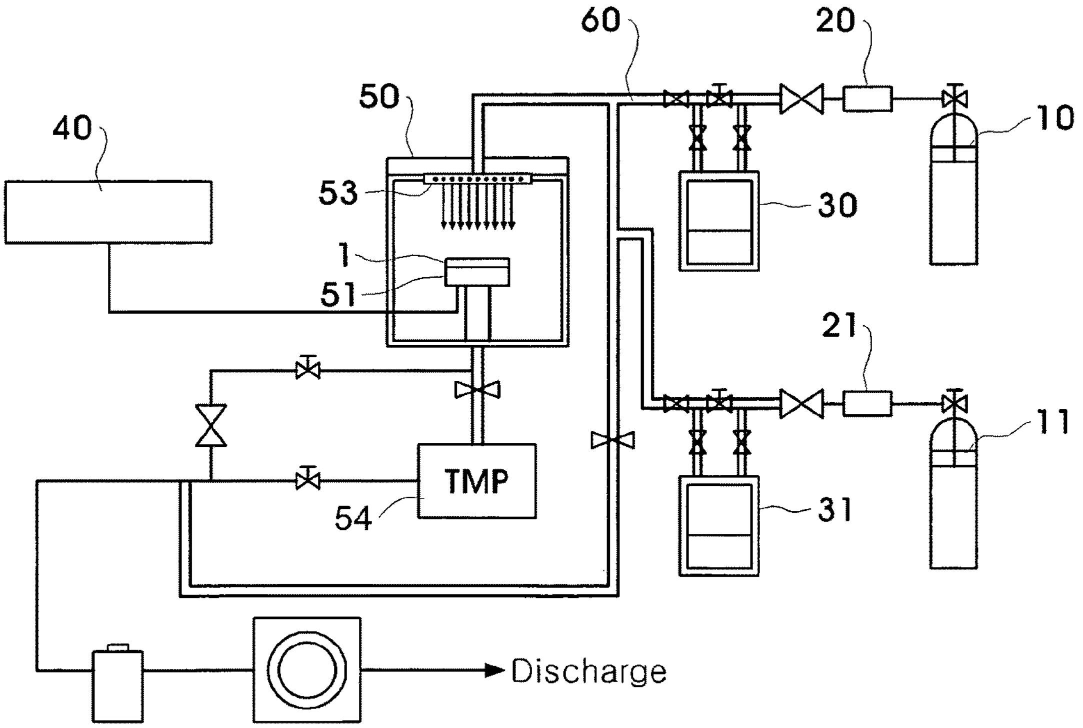
FIG. 1 is a view for schematically showing a PECVD apparatus used for manufacturing a low dielectric constant plasma polymerized thin film according to the present invention.

According to the present invention, a low dielectric constant plasma polymerized thin film is manufactured using precursors represented by Formulas 1 and 2 below.

Formula 1

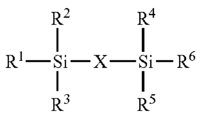

wherein $R^1$ to $R^6$ are each independently selected from the group consisting of a hydrogen atom and substituted or unsubstituted $C_{1\sim5}$ alkyl groups, and X is an oxygen atom or a $C_{1\sim5}$ alkylene group.

Formula 2

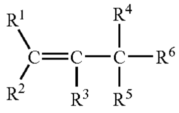

wherein $R^1$ to $R^6$ are each independently selected from the group consisting of a hydrogen atom and substituted or unsubstituted $C_{1\sim5}$ alkyl groups.

In Formula 1, the alkyl group has 1~5 carbon atoms and examples thereof include a methyl group, an ethyl group, a propyl group, and a butyl group. The alkyl group may be linear or branched, and one or more hydrogen atoms thereof may be substituted with a substituent such as a fluorine atom. Further, in Formula 1, X which is a linker may be an oxygen atom (—O—) or a $C_{1\sim5}$ alkylene group such as a methylene group or an ethylene group. Particularly useful is an oxygen atom (—O—).

Also in Formula 2, the alkyl group has 1~5 carbon atoms and examples thereof include a methyl group, an ethyl group, a propyl group, and a butyl group, as in Formula 1. The alkyl group may be linear or branched, and one or more hydrogen atoms thereof may be substituted with a substituent such as a fluorine atom. In particular, for condensation and/or hydrolysis with the precursor of Formula 1, it is preferred that $R^1$ to $R^3$ be a hydrogen atom.

In the present invention, an example of the precursor represented by Formula 1 includes hexamethyldisiloxane represented by Formula 3 below, and an example of the precursor of Formula 2 includes 3,3-dimethyl-1-butene (neohexene) represented by Formula 4 below.

Formula 3

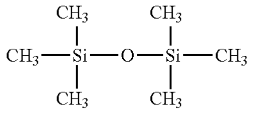

Formula 4

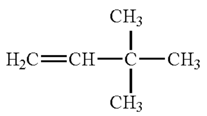

The linear organic/inorganic precursors of Formulas 1 and 2 may be used in combinations thereof, such that pores having a size of nanometers or smaller are formed in the polymerized thin film. Further, the dielectric constant is remarkably decreased, and as well, mechanical properties including hardness and elastic modulus may be increased.

The low dielectric constant plasma polymerized thin film is preferably manufactured using PECVD, in order to reduce the complicated process and long process time for pretreatment and post-treatment arising in a spin casting process.

In addition, the present invention provides a method of manufacturing the low dielectric constant plasma polymerized thin film using PECVD, including depositing a plasma polymerized thin film on a substrate using the precursors of Formulas 1 and 2 and annealing the deposited thin film using an RTA apparatus.

In the method of the present invention, depositing the plasma polymerized thin film on the substrate includes vaporizing the precursors of Formulas 1 and 2 in bubblers, supplying the gaseous precursors into a reactor for plasma deposition from the bubblers, and forming a plasma polymerized thin film on a substrate in the reactor using plasma of the reactor.

A PECVD apparatus for performing the PECVD process includes a reactor which is a process chamber composed of an upper chamber lid and a lower chamber body, for performing the thin film deposition process. The reactant gases are uniformly sprayed onto a substrate placed on the upper surface of a susceptor formed in the chamber body via shower heads provided in the chamber lid, thus depositing the thin film. This reaction is activated by RF energy which is supplied through an electrode mounted in the susceptor, such that the thin film deposition process is carried out. The thin film thus deposited is placed on the susceptor of the RTA apparatus as an annealing apparatus, after which the annealing process is rapidly conducted at predetermined temperatures.

Below, a detailed description will be given of a low dielectric constant plasma polymerized thin film and a manufacturing method thereof according to the present invention, with reference to the appended drawings.

FIG. 1 shows the PECVD apparatus used for manufacturing the low dielectric constant plasma polymerized thin film according to the present invention.

An example of the PECVD apparatus includes, but is not limited to, an electric condenser type PECVD apparatus. Alternatively, other kinds of PECVD apparatus may be used.

The PECVD apparatus includes first and second carrier gas storing portions 10, 11 containing a carrier gas such as Ar, first and second flow rate controllers 20, 21 for controlling the number of moles of gases passing therethrough, first and second bubblers 30, 31 containing solid or liquid precursors, a reactor 50 in which the reaction occurs, and a RF generator 40 for generating plasma in the reactor 50. The carrier gas storing portions 10, 11, the flow rate controllers 20, 21, the bubblers 30, 31, and the reactor 50 are connected through a pipeline 60. In the reactor 50, a susceptor 51 connected to the RF generator 40 for generating plasma and for supporting a substrate 1 thereon is provided. Further, a heater (not shown) is embedded in the susceptor 51, so that the substrate 1 placed on the susceptor 51 is heated to a temperature appropriate for deposition in the course of thin film deposition. Further, a turbo molecular pump (TMP) 54 is operably connected to the reactor 50. Further, an exhaust system is provided under the reactor 50 so as to discharge the reactant gases remaining in the reactor 50 after the completion of the deposition reaction.

According to the embodiment of the present invention, the method of depositing the thin film using the PECVD apparatus is described below.

The substrate 1 made of silicon ($P^{++}$—Si) doped with boron having metallic properties is washed with trichloroethylene, acetone, or methanol, and is then placed on the susceptor 51 of the reactor 50.

The first and second bubblers 30, 31 respectively contain precursors of Formulas 1 and 2, and the first and second bubblers 30, 31 are heated to temperatures adequate for the vaporization of the respective precursors. As such, it should be noted that the two types of precursors be respectively loaded into the two bubblers 30, 31, without discrimination of the bubblers, and the heating temperature of the bubblers be controlled depending on the types of precursors respectively loaded therein.

In the first and second carrier gas storing portions 10, 11, a carrier gas, selected from among argon (Ar), helium (He), neon (Ne) and gas combinations thereof, is loaded and flows via the pipeline 60 by means of the first and second flow rate controllers 20, 21. The carrier gas flowing along the pipeline 60 is introduced into the precursor solutions of the bubblers 30, 31 via the inlet ports of the bubblers so that bubbles occur, after which it flows along with the gaseous precursors again into the pipeline 60 passing out via the outlet ports of the bubblers.

The carrier gas and the gaseous precursors flowing along the pipeline 60 from the bubblers 30, 31 are sprayed through the shower heads 53 of the reactor 50. Here, the RF generator 40 is connected to the shower heads 53 so that the reactant gases sprayed through the shower heads 53 are converted into a plasma state. The precursors, which are sprayed through the shower heads 53 of the reactor 50 and converted into a plasma state, are deposited on the substrate 1 placed on the susceptor 51, thus forming a thin film. The gases remaining after the completion of the deposition reaction are discharged to the outside via the exhaust system provided under the reactor.

The pressure of the carrier gas of the reactor 50 is set to $1\times10^{-1}$~$10\times10^{-1}$ Torr to optimize the formation of the thin film, and the temperature of the substrate 1 is preferably 20~50° C. If the temperature of the substrate 1 falls outside of the above range, the deposition rate is lowered. The temperature of the substrate 1 is controlled using a heater embedded in the susceptor. Further, power supplied to the RF generator 40 is 15~80 W. In the case where the magnitude of power is above or below the above range, the formation of the low dielectric constant thin film is hard to achieve. The frequency of plasma thus generated is 10~20 MHz. In this way, the pressure of the carrier gas, the temperature of the substrate 1, and the supplying power are set to form the optimal plasma frequency so that the precursors are converted into a plasma state and then deposited on the substrate 1, and may be appropriately adjusted depending on the types of precursors. In the case where hexamethyldisiloxane and 3,3-dimethyl-1-butene are used as the precursors, the above factors are adjusted so that the plasma frequency is about 13.56 MHz.

Figure 2:
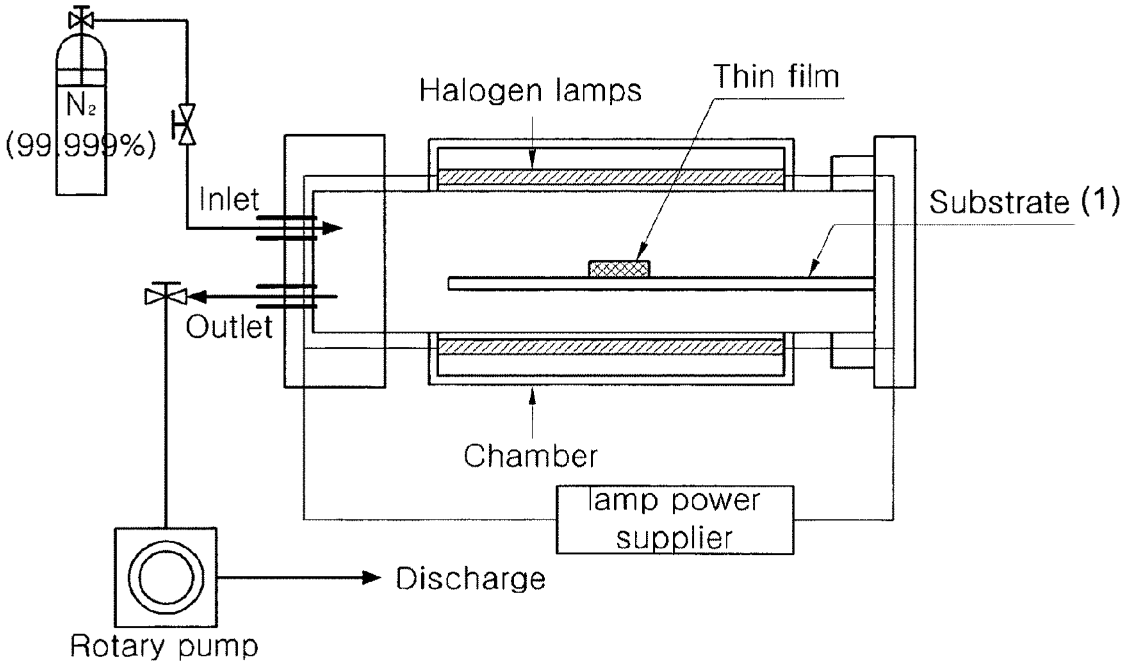
FIG. 2 is a view for schematically showing an RTA (Rapid Thermal Annealing) apparatus used for manufacturing the low dielectric constant plasma polymerized thin film according to the present invention.

FIG. 2 shows the RTA (rapid thermal annealing) apparatus for performing the annealing process.

The RTA apparatus is used to perform the heat treatment of a specimen, activate electrons in a semiconductor device process, change the properties of an interface between a thin film and a thin film or between a wafer and a thin film, and increase the density of a thin film. Further, this apparatus functions to convert the state of the grown thin film, decrease the loss due to ion implantation, and aid the transport of electrons from a thin film to another thin film or from a thin film to a wafer. Such RTA is carried out using heated halogen lamps and hot chucks. The RTA process may be conducted for a process time shorter than when using a furnace, and is thus referred to as RTP (Rapid Thermal Process). Using such a heat treatment apparatus, the plasma deposited thin film is annealed.

The substrate 1 having the thin film deposited thereon is placed in a chamber of the RTA apparatus, and heat is generated while orange light is emitted, using a plurality of halogen lamps (wavelength: about 2 μm) disposed around the chamber. The RTA process is preferably performed by annealing the substrate having the plasma deposited thin film placed thereon at 300~600° C. If the annealing temperature is lower than 300° C., the properties of the initially deposited thin film are not changed. Conversely, if the annealing temperature is higher than 600° C., the structure of the thin film may be undesirably converted from the low dielectric constant thin film into an $SiO_2$ thin film. Preferably, thus, the treatment temperature is increased to the above annealing temperature within 5 min and then annealing is performed for 1~5 min in order to effectively change the structure of the thin film. The RTA is performed at a pressure of $1\times10^{-1}$~$100\times10^{-1}$ Torr in nitrogen gas.

In order to evaluate the effects of the plasma polymerized thin film and the annealed plasma polymerized thin film, the following example is conducted, which is set forth to illustrate, but is not to be construed to limit the present invention.

EXAMPLE

Using a PECVD apparatus as seen in FIG. 1, precursors, for example, hexamethyldisiloxane (hereinafter referred to as 'HMDSO') and 3,3-dimethyl-1-butene (neohexene, hereinafter referred to as 'NHex') were respectively loaded into first and second bubblers 30, 31, after which the bubblers were respectively heated to 55° C. and 45° C., thus vaporizing the precursor solutions. The gaseous precursors were sprayed along with argon (Ar) gas, having an ultra high purity of 99.999% and acting as a carrier gas, through the shower heads 53 of a reactor 50 for plasma deposition, and were then plasma-deposited on the substrate 1. The pressure of Ar of the reactor 50 was $5\times10^{-1}$ Torr, and the temperature of the substrate was 35° C. Further, power supplied to the RF generator was 15~80 W, and the resulting plasma frequency was about 13.56 MHz.

The plasma polymerized thin film thus deposited is referred to as 'HMDSO:NHex'. The thickness of the HMDSO:NHex was measured to be 0.4~0.5 μm. The deposition is supposed to occur according to the following mechanism. Specifically, monomers of the precursor mixture transferred into the reactor 50 are activated or decomposed to reactive species by means of plasma and thus condensed on the substrate 1. As such, because the cross-linking between the molecules of HMDSO and NHex is easily formed, the HMDSO:NHex deposited under appropriate conditions is easily cross-linked due to the silicon oxide group and the methyl group of HMDSO and thus has good thermal stability, and also, the polymerization between the methyl group of HMDSO and NHex is seen to efficiently take place.

The HMDSO:NHex thus obtained was annealed using an RTA apparatus illustrated in FIG. 2. The HMDSO:NHex was placed on a substrate 1, and heat was generated by means of 12 halogen lamps (wavelength: about 2 μm) disposed around the substrate, so that the HMDSO:NHex was annealed to 450° C. for 5 min in a nitrogen atmosphere. The pressure of nitrogen gas was 1.0 Torr.

The effects of the HMDSO:NHex and the annealed HMDSO:NHex obtained by annealing the HMDSO:NHex using nitrogen were confirmed through the following experiments. In the drawings, 'as-deposited thin film' and '450° C.-annealed thin film' are defined as follows.

As-Deposited Thin Film: initial HMDSO:NHex after the plasma deposition

Figure 3:
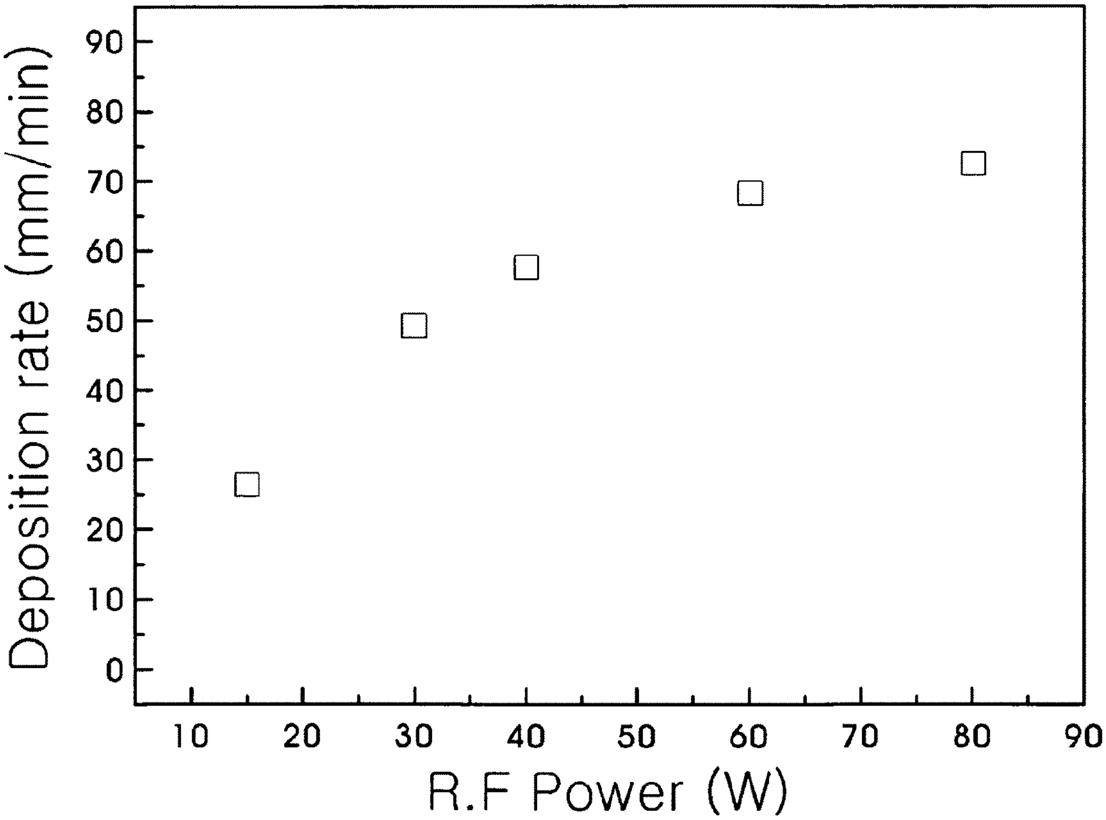
FIG. 3 is a graph showing the deposition rate of the low dielectric constant plasma polymerized thin film manufactured according to the present invention.

450° C.-Annealed Thin Film: annealed HMDSO:NHex obtained by subjecting the initial HMDSO:NHex to RTA using nitrogen gas FIG. 3 is a graph showing the deposition rate of the HMDSO:NHex. The deposition rate was seen to be increased in proportion to the increase in power.

Figure 4:
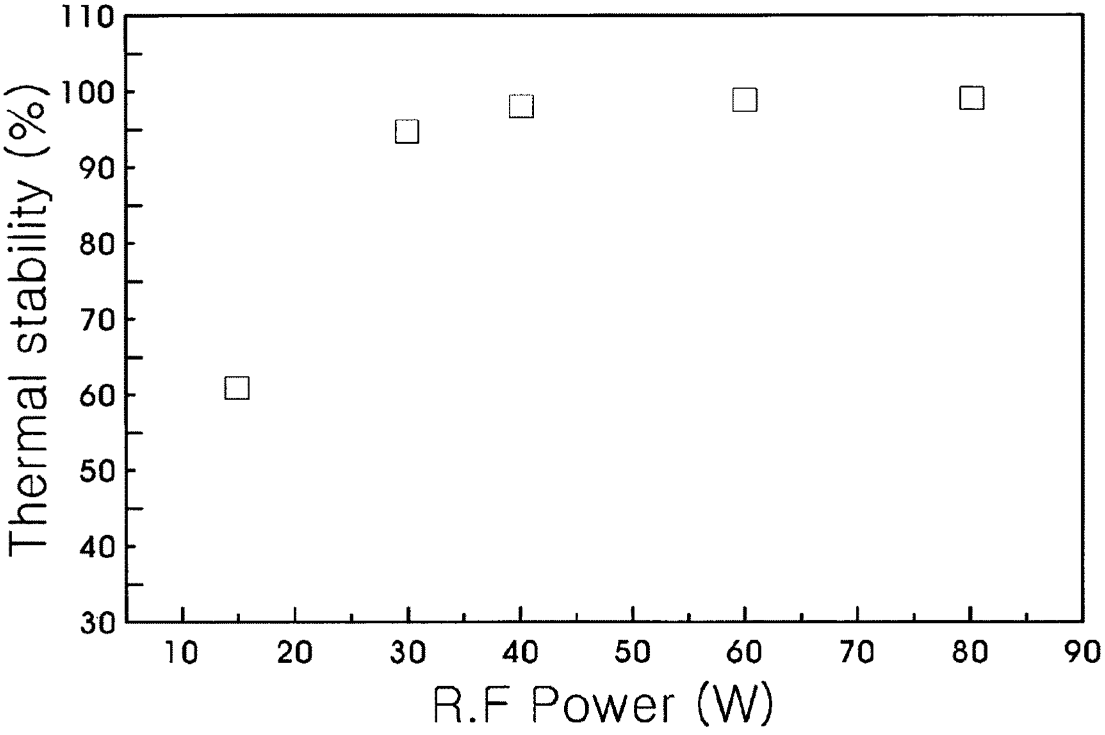
FIG. 4 is a graph showing the thermal stability of the low dielectric constant plasma polymerized thin film manufactured according to the present invention.

FIG. 4 is a graph showing the thermal stability of the annealed HMDSO:NHex. After performing the annealing process at 450° C. for 5 min, the thin film was maintained to the extent of 95% or more. Therefore, the low dielectric constant plasma polymerized thin film according to the present invention could be confirmed to have excellent thermal stability.

Figure 5:
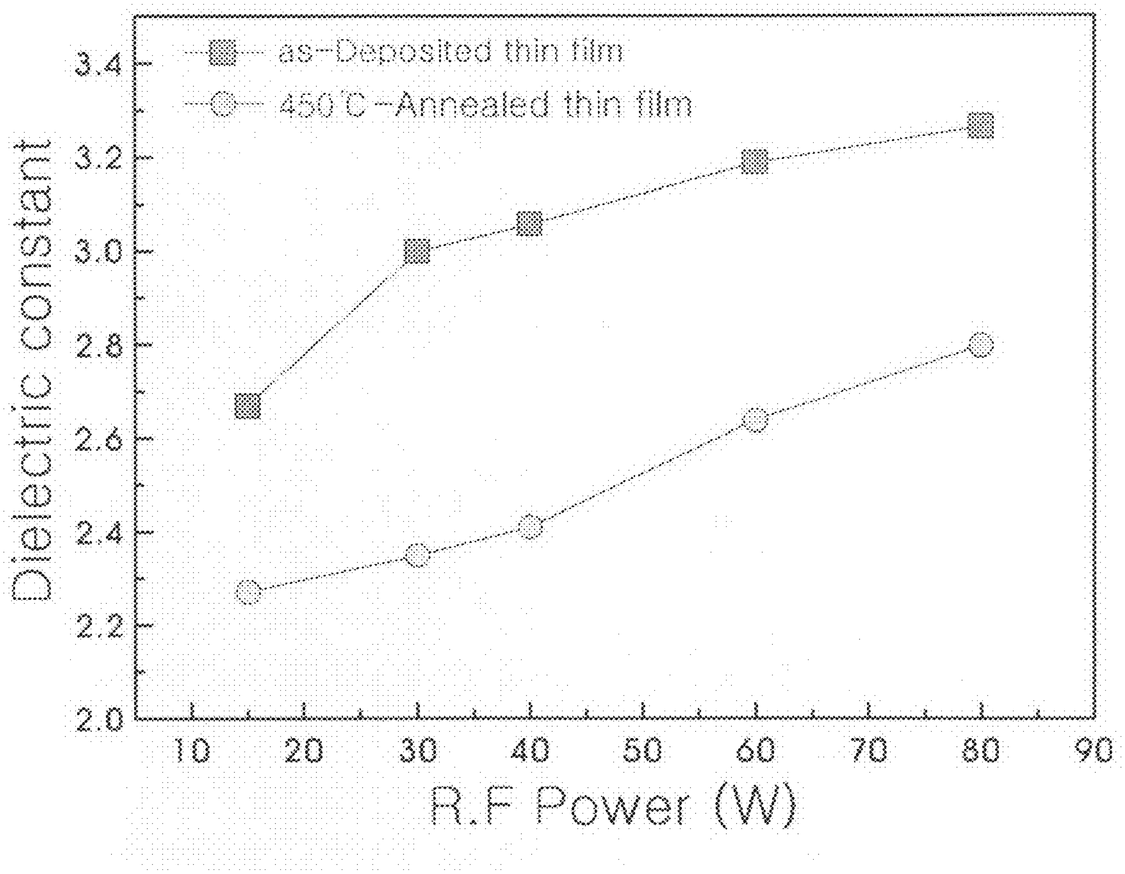
FIG. 5 is a graph showing the dielectric constant of the low dielectric constant plasma polymerized thin film manufactured according to the present invention.

FIG. 5 is a graph showing the relative dielectric constant for the HMDSO:NHex and the annealed HMDSO:NHex. The dielectric constant was measured by applying signals of frequency of 1 MHz to an electric condenser having a structure of Al/HMDSO:NHex/metallic-Si provided on a silicon substrate having very low resistance. As the power was increased, the dielectric constant of the HMDSO:NHex was measured. In this case, the relative dielectric constant of the HMDSO:NHex was increased from 2.67 to 3.27, and the relative dielectric constant of the annealed HMDSO:NHex was increased from 2.27 to 2.8. Thereby, the relative dielectric constant of the RTA-treated thin film was seen to be much lower than the dielectric constant of the plasma deposited thin film.

Figure 6A:
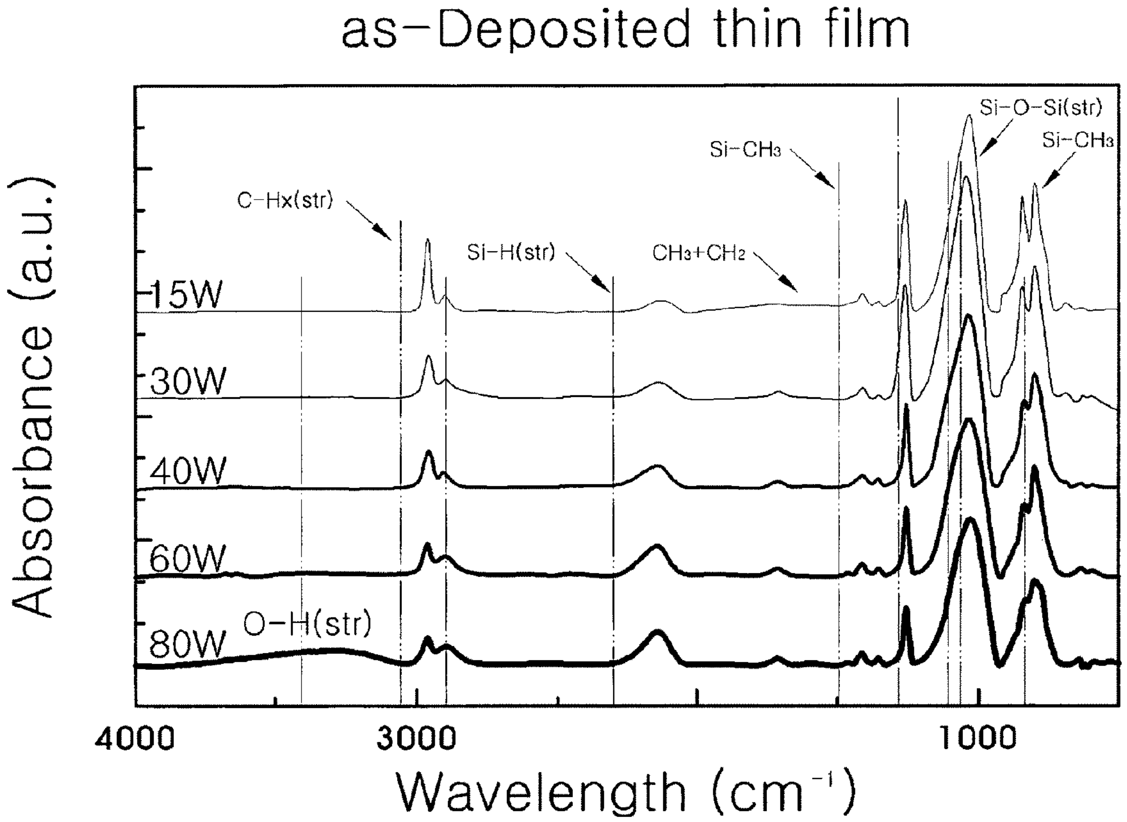
FIGS. 6A and 6B are graphs showing the chemical structures of the low dielectric constant plasma polymerized thin film before and after heat treatment, obtained through Fourier transform infrared spectroscopy.
Figure 6B:
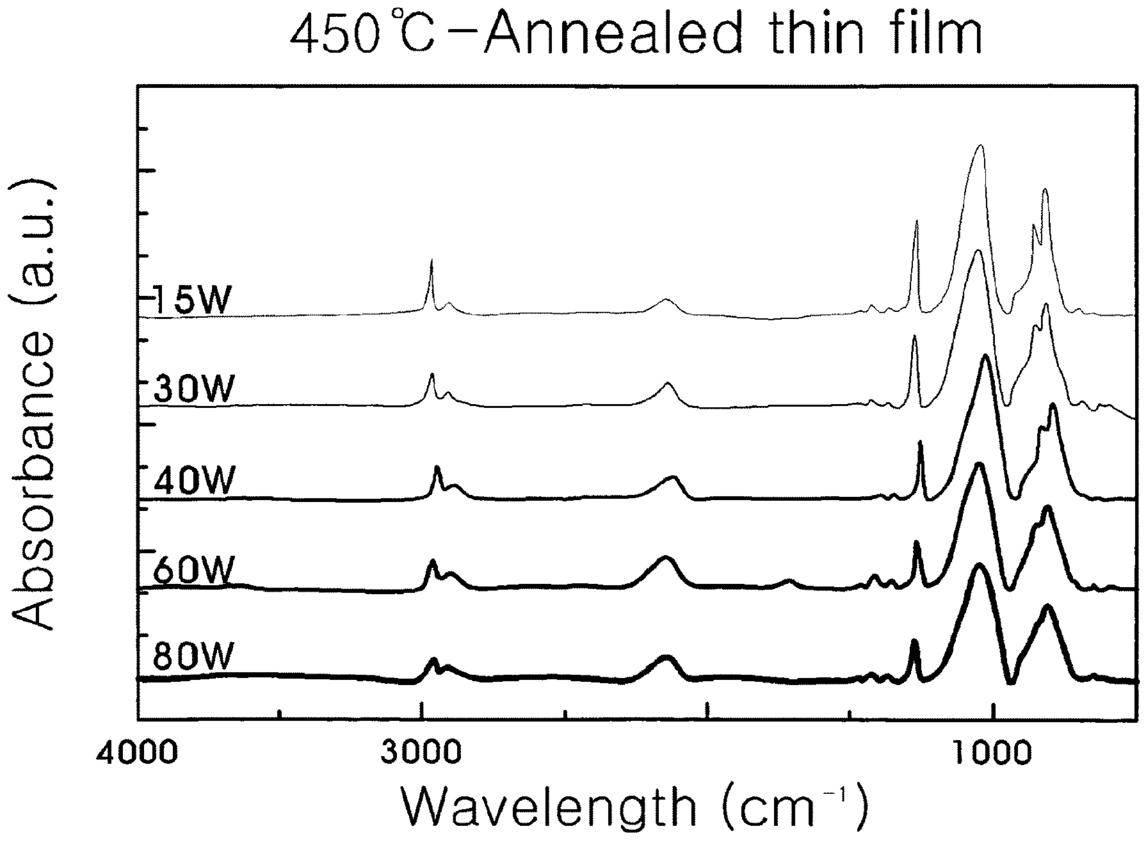

FIGS. 6A and 6B are graphs showing the chemical structures of the HMDSO:NHex and the annealed HMDSO:NHex, respectively, obtained through Fourier transform infrared spectroscopy. As depicted in FIGS. 6A and 6B, in the initial HMDSO:NHex and the annealed HMDSO:NHex, stretching vibrations for the respective chemical structures were generated at the same positions over the entire wavenumber range. Thereby, the HMDSO:NHex and the annealed HMDSO:NHex were confirmed to have similar bonding structures.

Figure 7A:
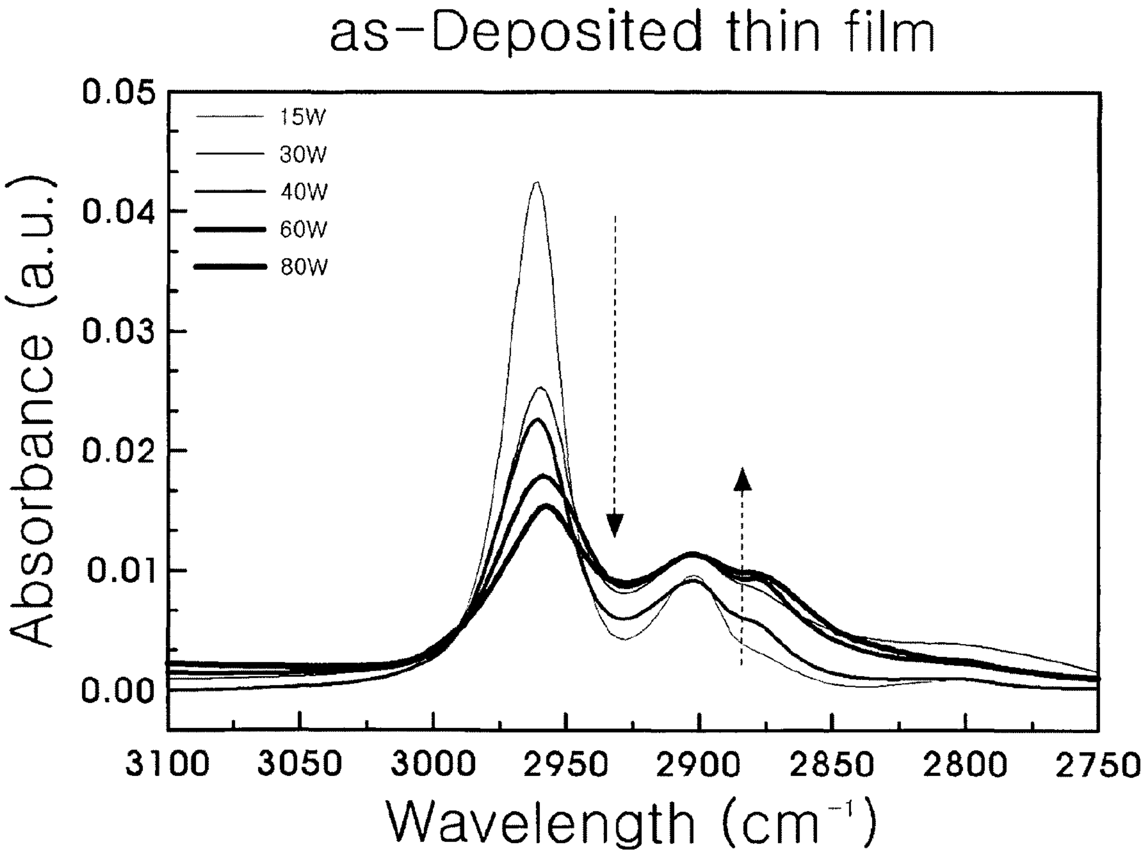
FIGS. 7A and 7B are graphs showing the chemical structures of hydrocarbon-based bonds of the low dielectric constant plasma polymerized thin film before and after heat treatment, obtained through Fourier transform infrared spectroscopy.
Figure 7B:
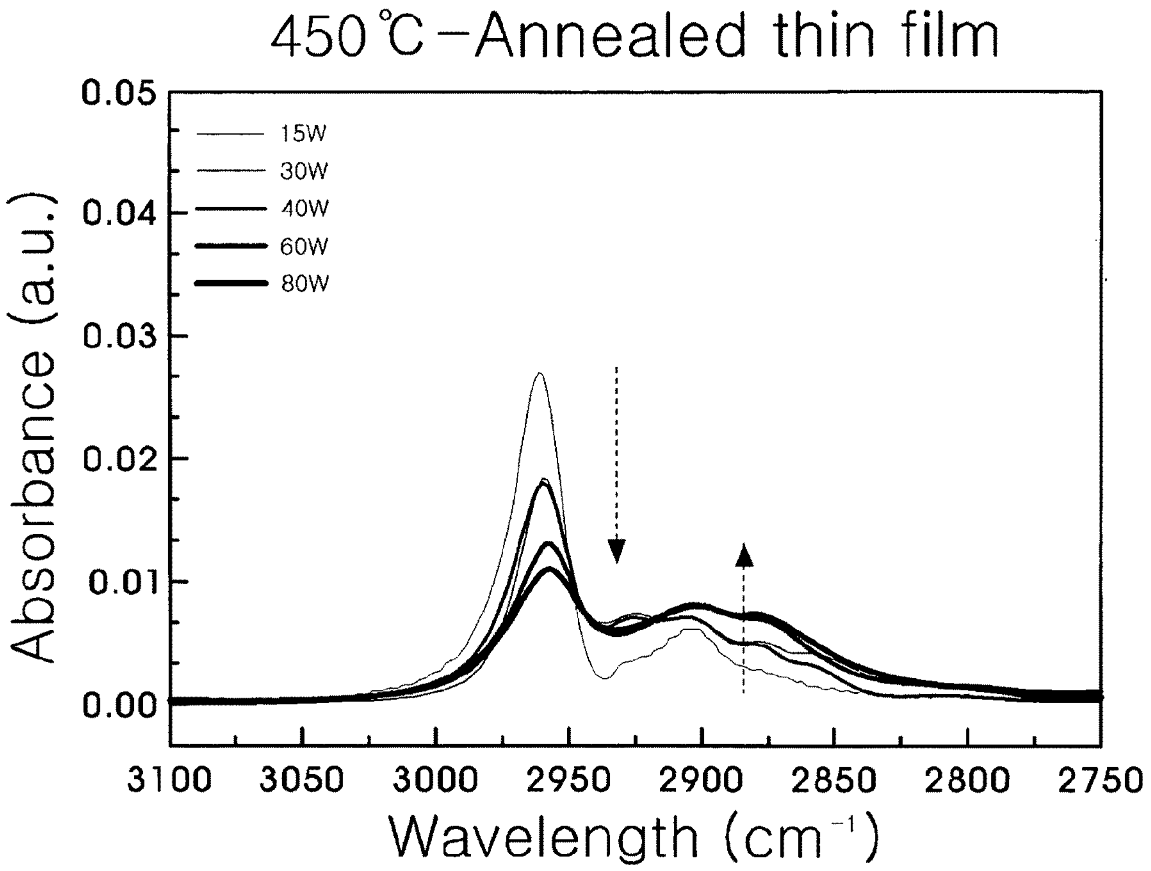

FIGS. 7A and 7B are graphs showing the chemical structures of hydrocarbon-based bonds of the HMDSO:NHex and the annealed HMDSO:NHex, respectively, obtained through Fourier transform infrared spectroscopy.

These graphs show the normalized absorbance of hydrocarbons ($CH_x$) corresponding to the organic material among the absorbance values over the entire wavenumber range. As seen in FIG. 7A, the absorbance of the HMDSO:NHex was gradually decreased in inverse proportion to the increase in power, and as seen in FIG. 7B, the absorbance of the annealed HMDSO:NHex was wholly decreased as compared to before the annealing process.

Figure 8A:
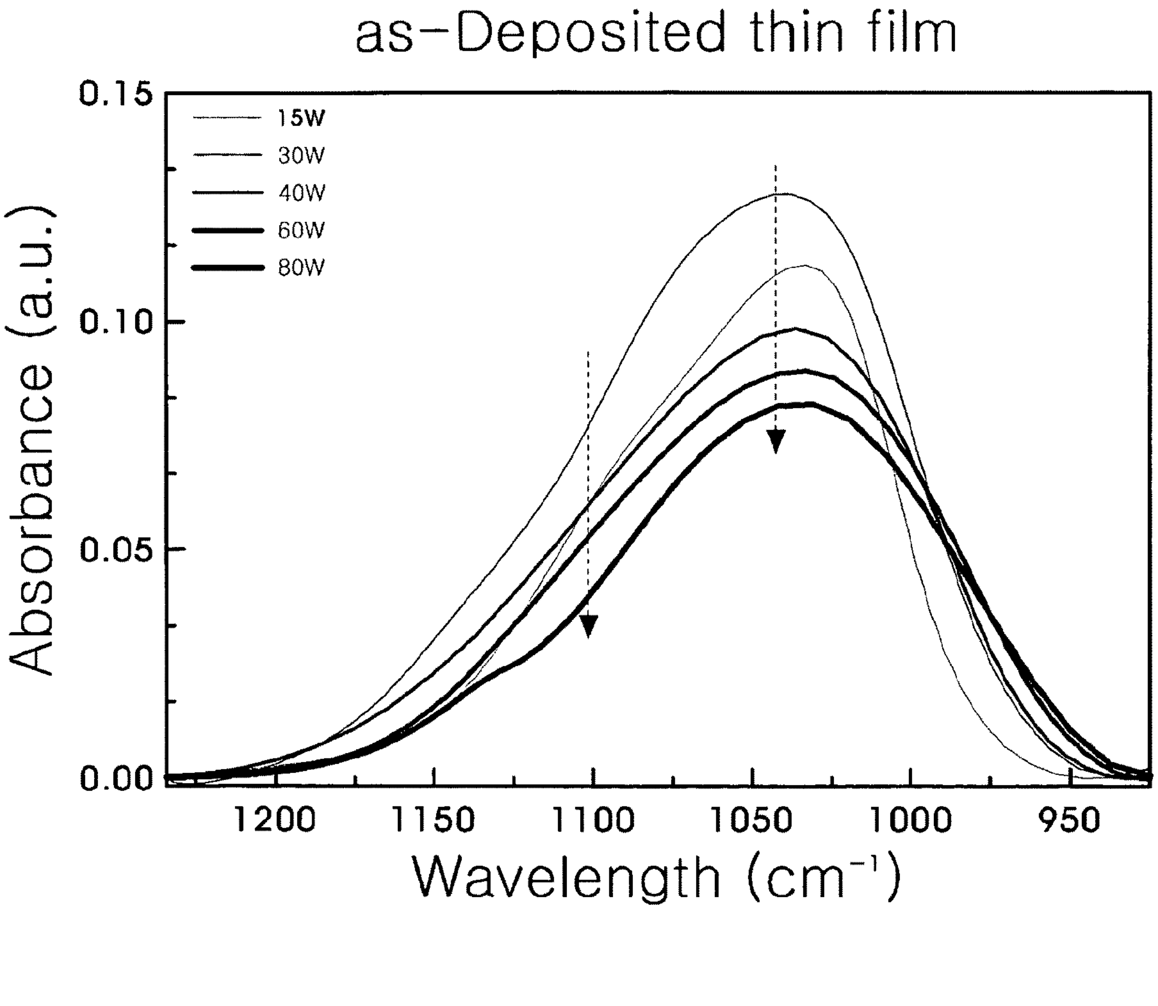
FIGS. 8A and 8B are graphs showing the chemical structures of silicon-oxygen-based bonds of the low dielectric constant plasma polymerized thin film before and after heat treatment, obtained through Fourier transform infrared spectroscopy.
Figure 8B:
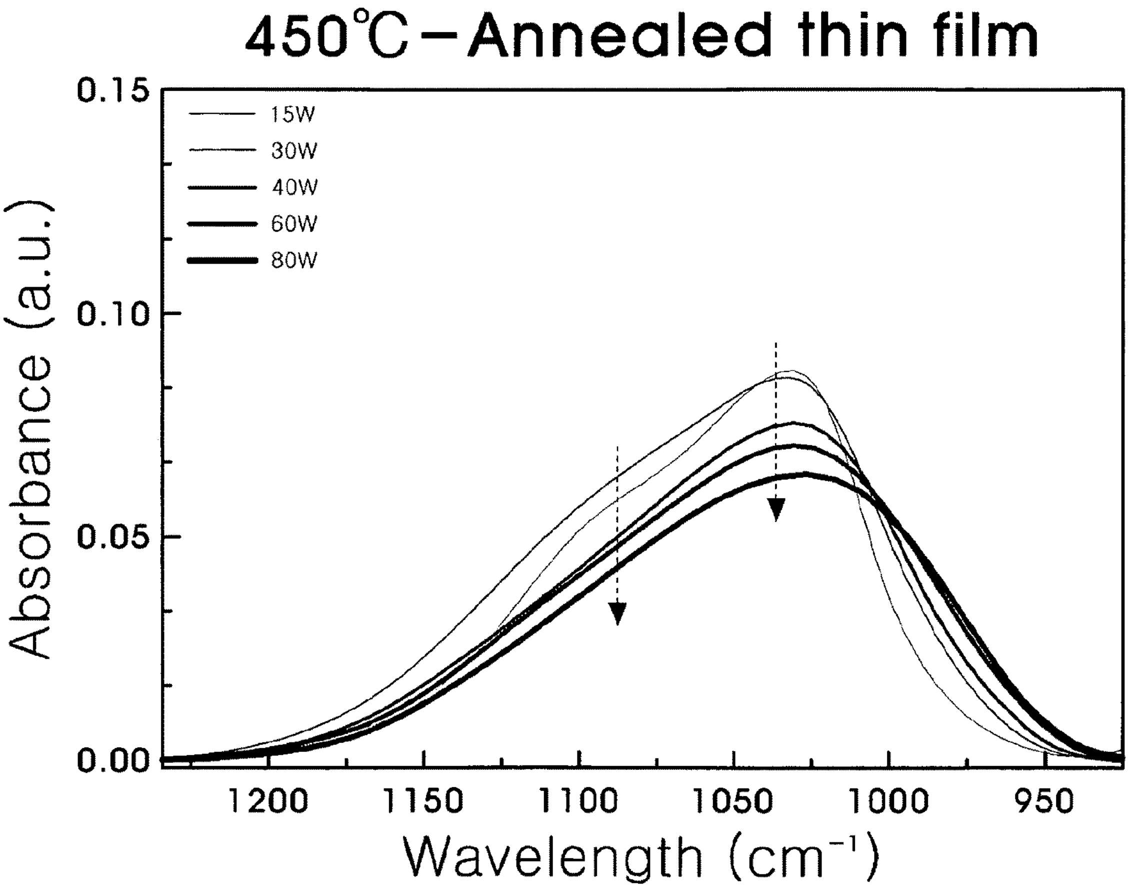

FIGS. 8A and 8B are graphs showing the chemical structures of silicon-oxygen-based bonds of the HMDSO:NHex and the annealed HMDSO:NHex, respectively, obtained through Fourier transform infrared spectroscopy.

As is apparent from the graphs showing the chemical bonds of silicon-oxygen-carbon (Si—O—C) and silicon-oxygen-silicon (Si—O—Si), the proportion of the silicon-based bonding which is a basic structure of the HMDSO:NHex was reduced after the annealing process.

Figure 9:
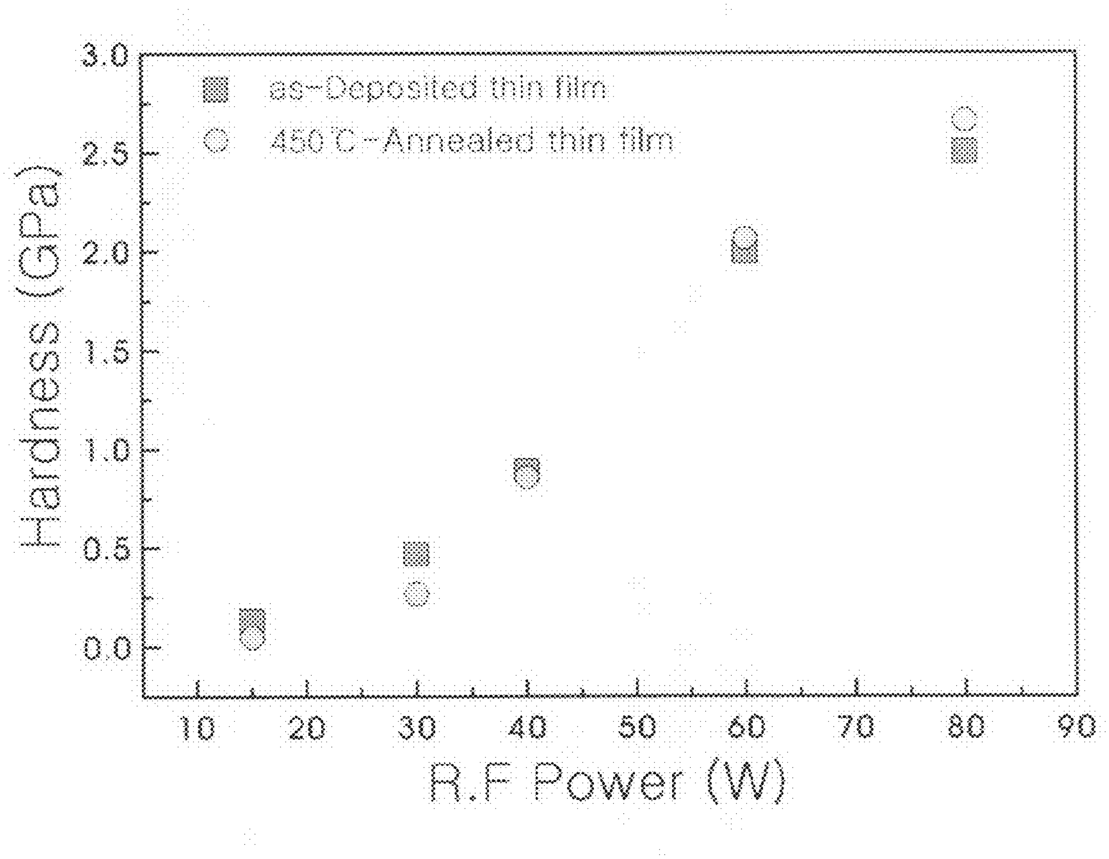
FIG. 9 is a graph showing the hardness of the low dielectric constant plasma polymerized thin film manufactured according to the present invention.

FIG. 9 is a graph showing the hardness of the HMDSO:NHex and the annealed HMDSO:NHex, as measured using a nano-indentor. When the power was increased, the hardness of the HMDSO:NHex was increased from 0.13 GPa to 2.50 GPa, and the hardness of the annealed HMDSO:NHex was increased from 0.05 GPa to 2.66 GPa.

Figure 10:
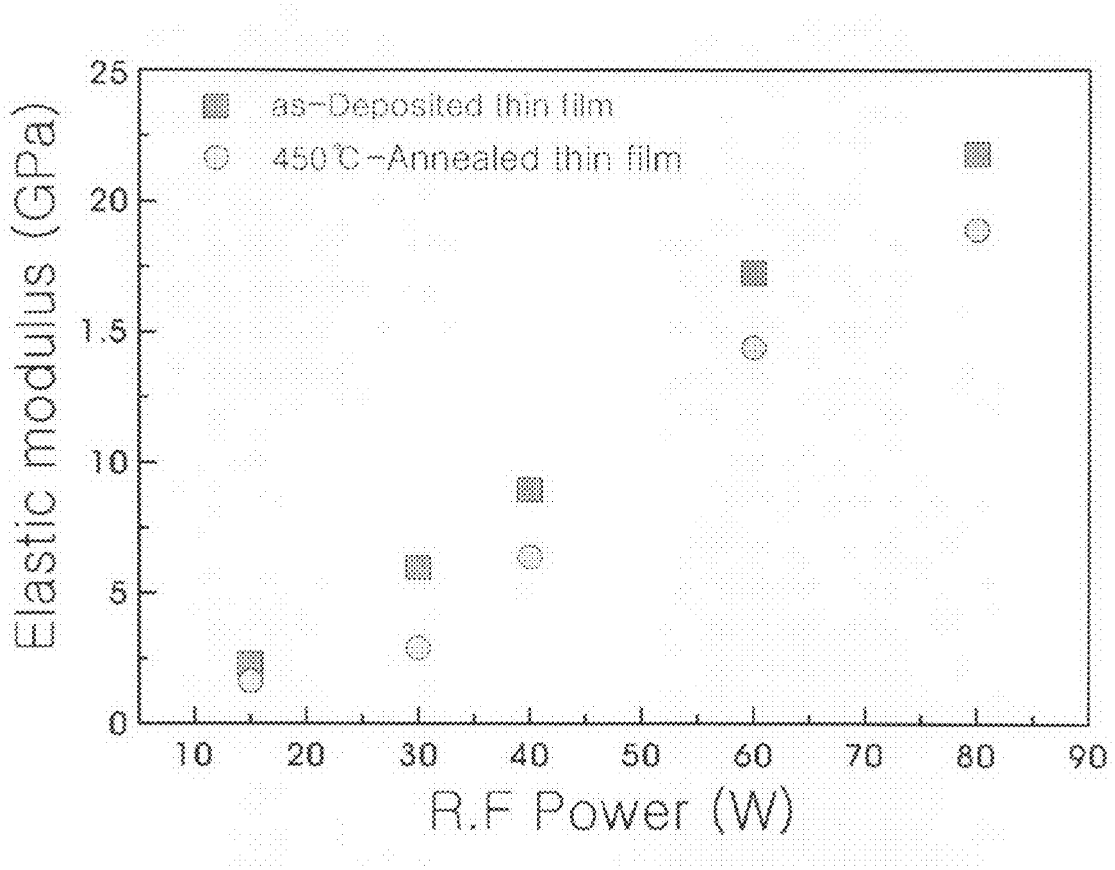
FIG. 10 is a graph showing the elastic modulus of the low dielectric constant plasma polymerized thin film manufactured according to the present invention.

FIG. 10 is a graph showing the elastic modulus of the HMDSO:NHex and the annealed HMDSO:NHex. When the power was increased, the elastic modulus of the HMDSO:NHex was increased from 2.25 GPa to 21.81 GPa, and the elastic modulus of the annealed HMDSO:NHex was increased from 1.66 GPa to 18.9 GPa; the elastic modulus of the annealed thin film was lower than that of the plasma-deposited thin film.

Therefore, the plasma polymerized thin film according to the present invention can be seen to be superior in terms of dielectric properties, uniform thin-film thickness, thermal stability, uniform chemical bonding structure, hardness, and elastic modulus.

As described hereinbefore, the present invention provides a low dielectric constant plasma polymerized thin film and a method of manufacturing the same. According to the present invention, the low dielectric constant thin film having a considerably low dielectric constant can be manufactured using linear organic/inorganic precursors, and further, a complicated process for pretreatment and post-treatment arising in the case of a spin casting process can be reduced. Furthermore, because annealing using an RTA apparatus is conducted, the dielectric constant and mechanical properties of the plasma polymerized thin film can be improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A low dielectric constant plasma polymerized thin film, manufactured using precursors consisting of hexamethyldisiloxane and a compound represented by Formula 2 below:

Formula 2

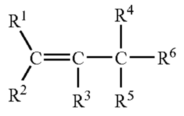

wherein $R^1$ to $R^6$ are each independently selected from the group consisting of a hydrogen atom and substituted or unsubstituted $C_{1\sim5}$ alkyl groups.

2. The low dielectric constant polymerized thin film as set forth in claim 1, which is manufactured using a plasma enhanced chemical vapor deposition process.

3. The low dielectric constant polymerized thin film as set forth in claim 1, wherein the precursor represented by Formula 2 is 3,3-dimethyl-1-butene.

4. A method of manufacturing a low dielectric constant plasma polymerized thin film, comprising:

depositing a plasma polymerized thin film on a substrate using precursors consisting of hexamethyldisiloxane and a compound represented by Formula 2 below through a plasma enhanced chemical vapor deposition process; and annealing the deposited thin film using a rapid thermal annealing (RTA) apparatus:

Formula 2

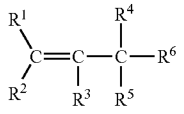

wherein $R^1$ to $R^6$ are each independently selected from the group consisting of a hydrogen atom and substituted or unsubstituted $C_{1\sim5}$ alkyl groups.

5. The method as set forth in claim 4, wherein the precursor represented by Formula 2 is 3,3-dimethyl-1-butene.

6. The method as set forth in claim 4, wherein the depositing the plasma polymerized thin film on the substrate comprises:

vaporizing the hexamethyldisiloxane and the precursor represented by Formula 2 in bubblers;

supplying the gaseous precursors into a reactor for plasma deposition from the bubblers; and forming a plasma polymerized thin film on the substrate in the reactor using plasma of the reactor.

7. The method as set forth in claim 6, wherein a pressure of a carrier gas of the reactor is $1\times10^{-1}\sim100\times10^{-1}$ Torr.

8. The method as set forth in claim 6, wherein a temperature of the substrate in the reactor is 20~50° C.

9. The method as set forth in claim 6, wherein power supplied to the reactor is 15~80 W.

10. The method as set forth in claim 9, wherein the annealing the deposited thin film using the RTA apparatus is conducted by increasing a temperature of the substrate to 300~600° C. within 5 min and then performing annealing.

11. The method as set forth in claim 6, wherein a pressure of a carrier gas of the reactor is greater than or equal to about $1\times10^{-1}$ Torr.

12. The method as set forth in claim 4, wherein the annealing the deposited thin film using the RTA apparatus is conducted by placing the substrate having the plasma polymerized thin film deposited thereon in a chamber of the RTA apparatus, and generating heat on the substrate using a plurality of halogen lamps disposed around the chamber.

13. The method as set forth in claim 4, wherein the annealing the deposited thin film using the RTA apparatus is conducted in nitrogen gas.

14. The method as set forth in claim 4, wherein the annealing the deposited thin film using the RTA apparatus is conducted by increasing a temperature of the substrate to 300~600° C. and then performing annealing.

15. The method as set forth in claim 4, wherein the annealing the deposited thin film using the RTA apparatus is conducted by annealing the substrate for 1~5 min.

16. The method as set forth in claim 4, wherein the annealing the deposited thin film using the RTA apparatus is conducted at a pressure of 0.5~1.5 Torr.

17. The method as set forth in claim 4, wherein the annealing the deposited thin film using the RTA apparatus is conducted at a pressure greater than or equal to about 0.5 Torr.

18. The method as set forth in claim 4, wherein the annealing the deposited thin film using the RTA apparatus is conducted by increasing a temperature of the substrate to greater than or equal to about 300° C. and then performing annealing.

19. A method of manufacturing a low dielectric constant plasma polymerized thin film, comprising:

depositing a plasma polymerized thin film on a substrate using precursors consisting of a compound represented by Formula 1 and a compound represented by Formula 2 below through a plasma enhanced chemical vapor deposition process; and annealing the deposited thin film using an RTA apparatus, wherein the annealing the deposited thin film using the RTA apparatus is conducted at a pressure of 0.5~1.5 Torr:

Formula 1

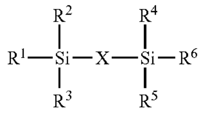

wherein R1 to R6 are each independently selected from the group consisting of a hydrogen atom and substituted or unsubstituted C1~5 alkyl groups, and X is an oxygen atom or a C1~5 alkylene group; and Formula 2

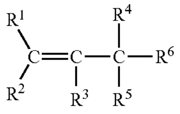

wherein R1 to R6 are each independently selected from the group consisting of a hydrogen atom and substituted or unsubstituted C1~5 alkyl groups.

* * * * *